US010186978B2

(12) United States Patent
Yamaguchi et al.

(10) Patent No.: US 10,186,978 B2
(45) Date of Patent: Jan. 22, 2019

(54) MODULAR POWER CONVERSION SEMICONDUCTOR DEVICE

(71) Applicant: Mitsubishi Electric Corporation, Tokyo (JP)

(72) Inventors: Kosuke Yamaguchi, Tokyo (JP); Tomofumi Tanaka, Tokyo (JP); Shinya Nakagawa, Tokyo (JP); Toru Iwagami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 346 days.

(21) Appl. No.: 14/690,751

(22) Filed: Apr. 20, 2015

(65) Prior Publication Data

US 2016/0036343 A1 Feb. 4, 2016

(30) Foreign Application Priority Data

Jul. 29, 2014 (JP) ................................ 2014-153806

(51) Int. Cl.
*H02M 7/00* (2006.01)
*H02M 5/458* (2006.01)
(Continued)

(52) U.S. Cl.
CPC ......... *H02M 7/003* (2013.01); *H02M 5/4585* (2013.01); *H02M 7/06* (2013.01);
(Continued)

(58) Field of Classification Search
CPC .................................................... H05K 7/1432
See application file for complete search history.

(56) References Cited

U.S. PATENT DOCUMENTS

2006/0284306 A1 12/2006 Taniuchi
2012/0261825 A1* 10/2012 Koike .................. H01L 21/565 257/773
(Continued)

FOREIGN PATENT DOCUMENTS

CN 1833318 A 9/2006
CN 102868319 A 1/2013
(Continued)

OTHER PUBLICATIONS

An Office Action issued by German Patent Office dated Feb. 6, 2018, which corresponds to German Patent Application No. 10 2015 213 491.1 and is related to U.S. Appl. No. 14/690,751; with English translation.
An Office Action issued by the Chinese Patent Office dated Apr. 25, 2018, which corresponds to Chinese Patent Application 201510455805.X and is related to U.S. Appl. No. 14/690,751 with English translation.
(Continued)

*Primary Examiner* — Lex Malsawma
(74) *Attorney, Agent, or Firm* — Studebaker & Brackett PC

(57) ABSTRACT

Converter output terminals of a converter are located adjacent to each other on a first side and an external terminal for external connection of a composite module is located adjacent to the converter output terminal. AC input terminals of the converter are located on a second side. Each of the distances between the converter output terminals and between the converter output terminal and the external terminal is set to a first formation pitch. Each of the distances between the AC input terminals is set to a second formation pitch. The first formation pitch is set to be equal to the second formation pitch.

5 Claims, 5 Drawing Sheets

(51) Int. Cl.
*H02M 7/06* (2006.01)
*H02M 7/537* (2006.01)
*H05K 7/14* (2006.01)

(52) U.S. Cl.
CPC .......... *H02M 7/537* (2013.01); *H05K 7/1432* (2013.01); *H01L 2224/48139* (2013.01); *H01L 2224/49111* (2013.01); *H01L 2224/49113* (2013.01)

(56) References Cited

U.S. PATENT DOCUMENTS

| | | | | |
|---|---|---|---|---|
| 2014/0265942 | A1* | 9/2014 | Li | H02P 5/74 318/51 |
| 2015/0084173 | A1* | 3/2015 | Zhang | H01L 23/49575 257/676 |

FOREIGN PATENT DOCUMENTS

| | | | |
|---|---|---|---|
| EP | 1028520 | A1 | 8/2000 |
| JP | 2003-018863 | A | 1/2003 |
| JP | 2008-263210 | A | 10/2008 |
| WO | 98/10508 | A1 | 3/1998 |

OTHER PUBLICATIONS

An Office Action issued by Chinese Patent Office dated Sep. 5, 2017, which corresponds to Chinese Patent Application No. 201510455805.X and is related to U.S. Appl. No. 14/690,751.

* cited by examiner

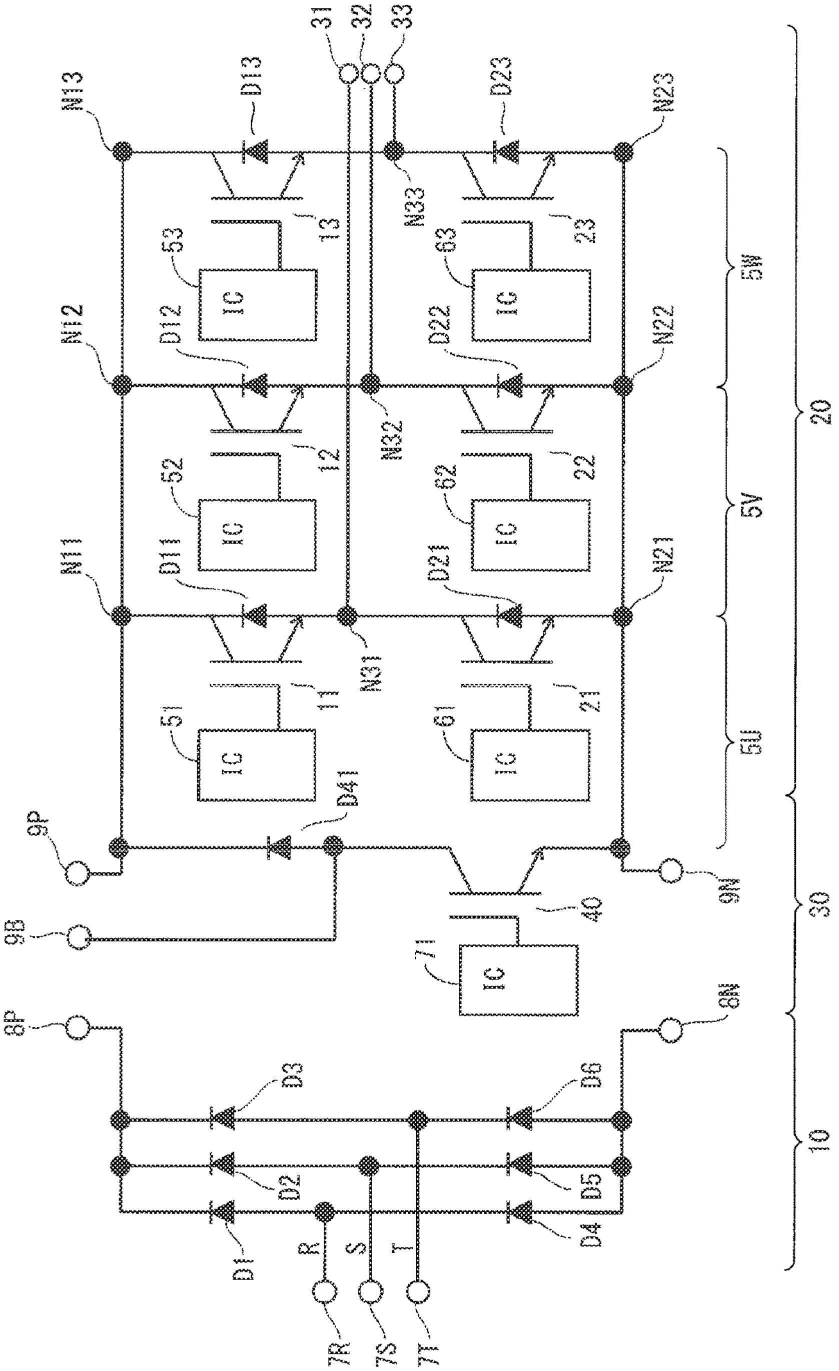
F I G. 5

MODULAR POWER CONVERSION SEMICONDUCTOR DEVICE

BACKGROUND OF THE INVENTION

Field of the Invention

The present invention relates to a semiconductor device having a modular structure in which a converter and an inverter are integrally included.

Description of the Background Art

As disclosed in, for example, International Publication No. WO 98/10508 (FIG. 15), a semiconductor device has a molecular structure described as follows. The semiconductor device includes a metal substrate, a plurality of wires that are fixed to the metal substrate with an insulating layer therebetween, and power circuitry that is electrically connected to the plurality of wires. The power circuitry includes a plurality of circuit portions (such as a converter circuit portion) that are electrically connected between the plurality of wires. The circuit portions include a plurality of external terminals for external connection that are integral therewith and are bonded to the plurality of wires.

The traditional semiconductor device disclosed in International Publication No. WO 98/10508 (FIG. 15) includes, as the external terminals thereof, AC input terminals R, S, and T and converter output terminals P1 and N of the converter circuit portion. The converter input terminals R, S, and T and the converter output terminals P1 and N are located on the surfaces that face each other with the package therebetween.

In the configuration of the traditional semiconductor device described above, the output terminals P and N of the converter are required to be located on the same surface (on one surface) so as to have the shorter wiring for connection with the external capacitor. The AC input terminals R, S, and T of the converter are required to be located on the same surface (on another surface facing the one surface) on ground of the arrangement of, for example, a noise filter. Consequently, the substrate pattern wiring for the entire circuitry including such semiconductor device is limited. Thus, the substrate has unfortunately been difficult to design flexibly.

SUMMARY OF THE INVENTION

The present invention has an object to provide a semiconductor device integrally including a converter and an inverter to facilitate formation of wiring for external connection.

A semiconductor device according to the present invention has a rectangular shape in plan view and integrally includes a converter and an inverter in a sealing resin. The semiconductor device includes a plurality of converter output terminals, a plurality of converter input terminals, and an adjacent external terminal.

The plurality of converter output terminals are terminals for external connection that are electrically connected to the converter and are located on one side of the semiconductor device in plan view. The plurality of converter input terminals are terminals for external connection that are electrically connected to the converter and are located on another side facing the one side in plan view. The adjacent external terminal is a terminal for external connection that is located adjacent to the plurality of converter output terminals on the one side.

The plurality of converter output terminals and the adjacent external terminal are categorized as a first terminal group and the plurality of converter input terminals are categorized as a second terminal group. The first and second terminal groups include an equal number of terminals. The semiconductor device has a terminal group pitch setting in which each of first distances between two terminals in the first terminal group that are adjacent to each other is set to be equal to each of second distances between two terminals in the second terminal group that are adjacent to each other.

The semiconductor device according to the present invention has the terminal group pitch setting described above. Thus, only the internal layout of the converter is mainly changed, to thereby selectively manufacture a first-type semiconductor device and a second-type semiconductor device that have opposite positional relations between the first and second terminal groups on the one side and the other side.

Therefore, one of the first-type and second-type semiconductor devices that facilitates formation of the wiring for electrical connection with, for example, external elements can be selected as appropriate. This is effective in forming, with relative ease, the entire circuitry including the semiconductor device according to the present invention.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram illustrating equivalent circuits in a converter, an inverter, and a brake shown in FIG. 4;

DESCRIPTION OF THE PREFERRED EMBODIMENTS

First Preferred Embodiment

Figure 1:
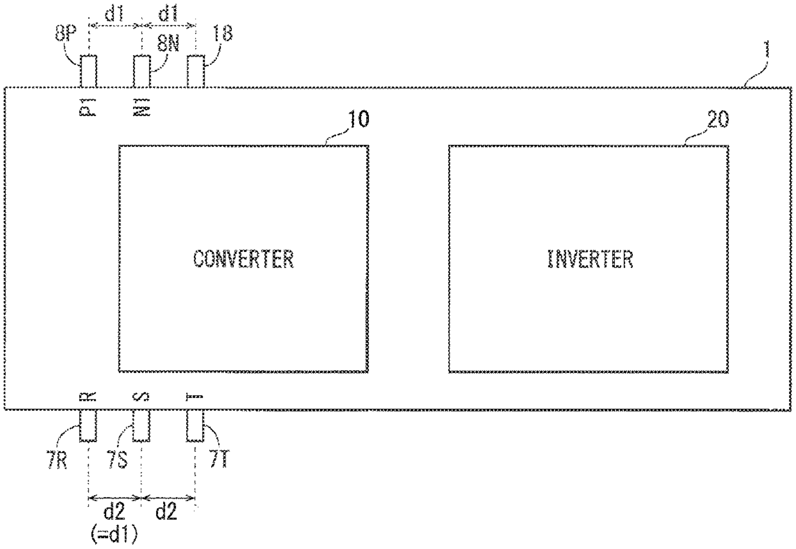
FIG. 1 is a diagram describing a configuration of a composite module according to a first preferred embodiment of the present invention.

FIG. 1 is a diagram describing a configuration of a composite module 1 according to a first preferred embodiment of the present invention. The composite module 1 according to the first preferred embodiment is a semiconductor device that has a rectangular shape in plan view and integrally includes a converter 10 and an inverter 20 in a sealing resin.

As shown in FIG. 1, converter output terminals 8P and 8N (P1 and N1) for external connection of the converter 10 are located adjacent to each other on a first side (the upper part in FIG. 1). An external terminal 18 (adjacent external terminal) for external connection of the composite module 1 is located adjacent to the converter output terminal 8N. The external terminal 18 may be provided for the converter 10, for the inverter 20, or for both the converter 10 and the inverter 20.

AC input terminals 7R, 7S, and 7T (R, S, and T) that are the converter input terminals for external connection of the converter 10 are located on a second side (the lower part in FIG. 1, the side facing the first side).

The plurality of converter output terminals including the converter output terminals 8P and 8N and the external terminal 18 are categorized as a first terminal group located on the first side of the composite module 1 and the plurality of converter input terminals including the AC input terminals 7R, 7S and 7T are categorized as a second terminal group located on the second side of the composite module 1. The number of terminals included in each of the first and second terminal groups is "3."

The composite module 1 according to the first preferred embodiment has a terminal group pitch setting in which each of formation pitches d1 (first distances) between two terminals in the first terminal group that are adjacent to each other is set to be equal to each of formation pitches d2 (second distances) between two terminals in the second terminal group that are adjacent to each other.

Thus, each of the distances between the converter output terminals 8P and 8N and between the converter output terminal 8N and the external terminal 18 is set to the formation pitch d1. Each of the distances between the AC input terminals 7R and 7S and between the AC input terminals 7S and 7T is set to the formation pitch d2. The formation pitch d1 is set to be equal to the formation pitch 2 (d1=d2).

Figure 2:
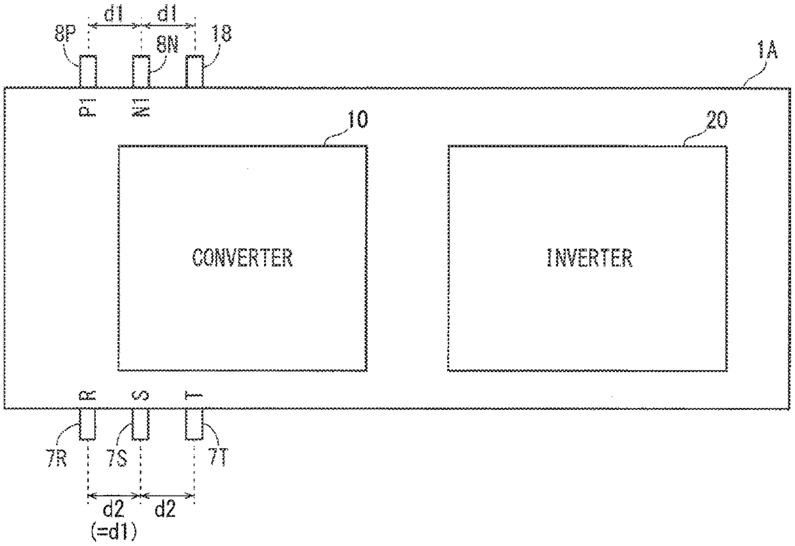
FIG. 2 is a diagram describing a configuration of the composite module that is a first-type composite module.

FIG. 2 is a diagram describing a configuration of a composite module 1A that is a first-type composite module. The composite module 1A is a first aspect of the composite module 1. As shown in FIG. 2, the converter 10 and the inverter 20 have, similarly to the composite module 1 shown in FIG. 1, the composite positional relation in which the converter 10 is located on the left side in plan view. The converter output terminals 8P and 8N and the external terminal 18 are located on the first side (the upper side in FIG. 2) and the AC input terminals 7R, 7S, and 7T are located on the second side (the lower side in FIG. 2). In this case, the composite module 1A has the terminal group pitch setting described above.

Figure 3:
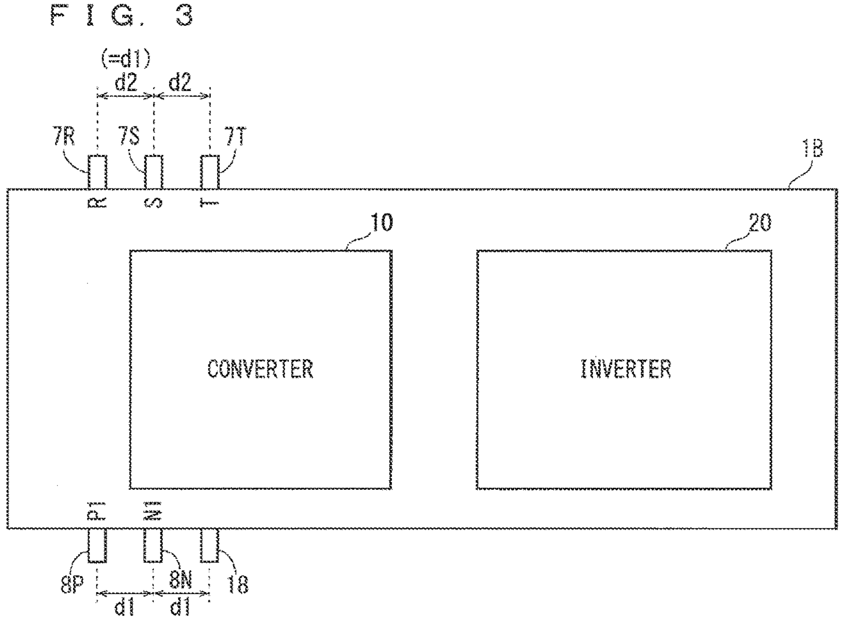
FIG. 3 is a diagram describing a configuration of the composite module that is a second-type composite module.

FIG. 3 is a diagram describing a configuration of a composite module 1B that is a second-type composite module. The composite module 1B is a second aspect of the composite module 1. As shown in FIG. 3, the converter 10 and the inverter 20 that are similar to those in FIG. 2 have the composite positional relation. The AC input terminals 7R, 7S, and 7T are located on the first side (the upper side in FIG. 3) and the converter output terminals 8P and 8N and the external terminal 18 (adjacent external terminal) are located on the second side (the lower side in FIG. 3).

The composite module 1 has the terminal group pitch setting described above. Thus, only the internal layout of the converter 10 is mainly changed, to thereby selectively manufacture the composite module 1A and the composite module 1B that have opposite positional relations between the first and second terminal groups on one side and another side.

Therefore, the composite modules 1A and 1B can be selectively formed as the composite module 1 with relative ease. Thus, depending on the usage pattern of the composite module 1, one of the composite modules 1A and 1B is selected as appropriate, providing the composite module 1 having a terminal configuration that facilitates formation of the wiring pattern for each substrate structure, such as the arrangement of a P-N capacitor to be located between the converter output terminals 8P and 8N and the arrangement of an input filter for the AC input terminals 7R, 7S and 7T.

As described above, one of the composite module 1A and the composite module 1B can be selected as appropriate, providing the composite module 1 in which the wiring for electrical connection with, for example, external elements is easily formed for external connection. This is effective in forming the entire circuitry including the composite module 1 (the composite module 1A or the composite module 1B) according to this preferred embodiment with relative ease.

Second Preferred Embodiment

Figure 4:
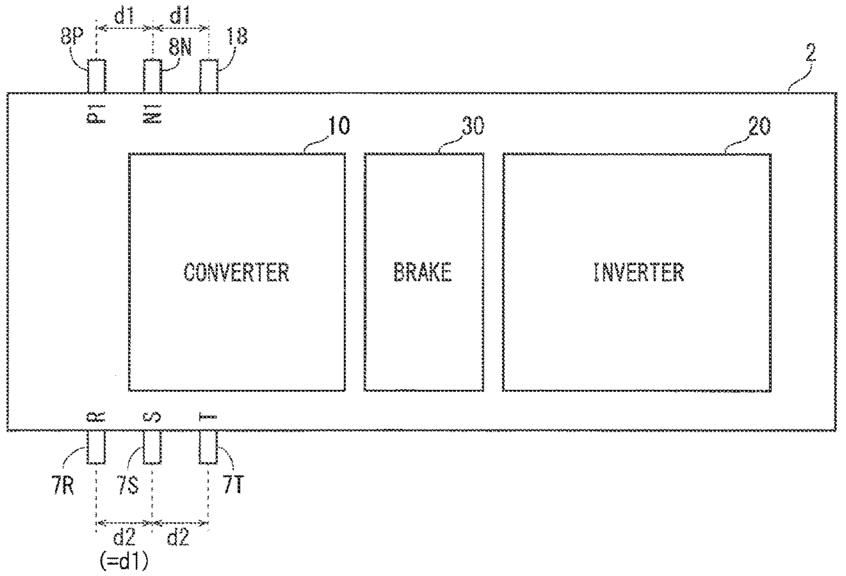
FIG. 4 is a diagram describing a configuration of the composite module according to a second preferred embodiment of the present invention.

FIG. 4 is a diagram describing a configuration of a composite module 2 according to a second preferred embodiment of the present invention. As shown in FIG. 4, the composite module 2 integrally includes, in addition to the converter 10 and the inverter 20, a brake 30 embedded in the sealing resin. The configuration except for the brake 30 is similar to that of the composite module 1 according to the first preferred embodiment shown in FIGS. 1 to 3.

FIG. 5 is a circuit diagram illustrating equivalent circuits in the converter 10, the inverter 20, and the brake 30 shown in FIG. 4.

As shown in FIG. 5, the converter 10 includes diodes D1, D2, and D3 and diodes D4, D5, and D6 located between the converter output terminals 8P and 8N. More particularly, the cathodes of the respective diodes D1, D2, and D3 are connected in common to the converter output terminal 8P, the anodes of the diodes D1, D2, and D3 are electrically connected to the cathodes of the diodes D4, D5, and D6, and the anodes of the respective diodes D4, D5, and D6 are connected in common to the converter output terminal 8N. The AC input terminals 7R, 7S, and 7T are located at the intermediate connection points between the anodes of the diodes D1, D2, and D3 and the cathodes of the diodes D4, D5, and D6. Alternating current signals of the R phase, the S phase, and the T phase are input to the AC input terminals 7R, 7S, and 7T.

The inverter 20 includes three arm portions being a U-phase circuit 5U, a V-phase circuit 5V, and a W-phase circuit 5W, each forming a unit inverter.

The U-phase circuit 5U includes IGBTs 11 and 21 and diodes D11 and D21. The V-phase circuit 5V includes IGBTs 12 and 22 and diodes D12 and D22. The W-phase circuit 5W includes IGBTs 13 and 23 and diodes D13 to D23.

In the U-phase circuit 5U, the IGBTs 11 and 21 are connected in series. The diodes D11 and D21 having anodes on the emitter side are located between the collector and the emitter of the IGBT 11 and between the collector and the emitter of the IGBT 21, respectively. In the V-phase circuit 5V, the IGBTs 12 and 22 are connected in series. The diodes D12 and D22 having anodes on the emitter side are located between the collector and the emitter of the IGBT 12 and between the collector and the emitter of the IGBT 22, respectively. In the W-phase circuit 5W, the IGBTs 13 and 23 are connected in series. The diodes D13 and D23 having anodes on the emitter side are located between the collector and the emitter of the IGBT 13 and between the collector and the emitter of the IGBT 23, respectively.

Nodes N11, N12, and N13 are connected in common to a DC bus terminal 9P. The node N11 is the connection point of the collector of the IGBT 11 and the cathode of the diode D11 in the U-phase circuit 5U. The node N12 is the connection point of the collector of the IGBT 12 and the cathode of the diode D12 in the V-phase circuit 5V. The node N13 is the connection point of the collector of the IGBT 13 and the cathode of the diode D13 in the W-phase circuit 5W.

Nodes N21, N22, and N23 are connected in common to an IGBT emitter terminal 9N of the brake 30. The node N21 is the connection point of the emitter of the IGBT 21 and the anode of the diode D21 in the U-phase circuit 5U. The node N22 is the connection point of the emitter of the IGBT 22 and the anode of the diode D22 in the V-phase circuit 5V. The node N23 is the connection point of the emitter of the IGBT 23 and the anode of the diode D23 in the W-phase circuit 5W.

Nodes N31, N32, and N33 are connected to intermediate terminals 31, 32, and 33, respectively. The node N31 is the connection point of the emitter of the IGBT 11 (the anode of the diode D11) and the collector of the IGBT 21 (the cathode of the diode D21) in the U-phase circuit 5U. The node N32 is the connection point of the emitter of the IGBT 12 and the collector of the IGBT 22 in the V-phase circuit 5V. The node N33 is the connection point of the emitter of the IGBT 13 and the collector of the IGBT 23 in the W-phase circuit 5W. The intermediate terminals 31, 32, and 33 are provided for the U-phase, the V-phase, and the R-phase, respectively.

In the brake 30, an IGBT 40 has the emitter (electrode) connected to the IGBT emitter terminal 9N and the collector (electrode) connected to the anode of a diode D41 and to an IGBT collector terminal 9B. The cathode of the diode D41 is connected to the DC bus terminal 9P.

ICs 51, 52, and 53 input control signals to the gates of the IGBTs 11, 12, and 13, respectively. ICs 61, 62, and 63 input control signals to the gates of the IGBTs 21, 22, and 23, respectively. IC 71 inputs control signals to the gate of the IGBT 40.

Referring back to FIG. 4, the composite module 2 according to the second preferred embodiment has the terminal group pitch setting similarly to the composite module 1 according to the first preferred embodiment. Thus, the composite modules 2 of the first type and the second type (corresponding to the composite module 1A and 1B) that have opposite positional relations between the first and second terminal groups on the one side and the other side can be selectively provided with relative ease, producing the effect similar to that of the first preferred embodiment.

In addition, the composite module 2 according to the second preferred embodiment includes the brake 30 embedded therein. The brake 30 produces the effect of suppressing an increase in voltage caused by the energy generated during regenerative operation of the motor. More particularly, the IGBT 40 is turned on during regenerative operation of the motor, so that the increase in voltage described above can be suppressed.

Third Preferred Embodiment

Figure 6:
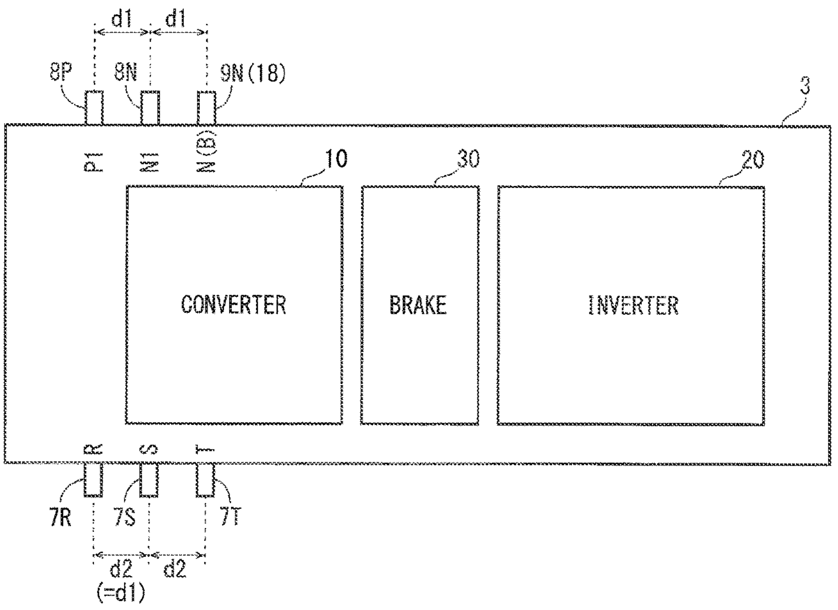
FIG. 6 is a diagram describing a configuration of the composite module according to a third preferred embodiment of the present invention.

FIG. 6 is a diagram describing a configuration of a composite module 3 according to a third preferred embodiment of the present invention. As shown in FIG. 6, similarly to the composite module 2 according to the second preferred embodiment, the composite module 3 integrally includes, in addition to the converter 10 and the inverter 20, the brake 30 embedded in the sealing resin.

The composite module 3 includes, as the external terminal 18, the IGBT emitter terminal 9N that is electrically connected to the emitter of the IGBT 40. The IGBT emitter terminal 9N is located adjacent to the converter output terminal 8N on one main-surface side having the converter output terminals 8P and 8N provided thereon. The IGBT emitter terminal 9N is located, as the external terminal 18, at the formation pitch d1 away from the converter output terminal 8N, thereby being categorized as the first terminal group together with the converter output terminals 8P and 8N. The configuration except for the above is similar to that of the composite module 2 according to the second preferred embodiment shown in FIGS. 4 and 5, and a description thereof is omitted as appropriate.

Similarly to the composite module 1 according to the first preferred embodiment, the composite module 3 according to the third preferred embodiment has the terminal group pitch setting. Therefore, the composite modules 3 of the first type and the second type (corresponding to the composite modules 1A and 1B) that have opposite positional relations between the first and second terminal groups on the one side and the other side can be selectively provided with relative ease, producing the effect similar to that of the first preferred embodiment.

In addition, the composite module 3 according to the third preferred embodiment includes the brake 30 embedded in the sealing resin. Similarly to the composite module 2 according to the second preferred embodiment, the brake 30 produces the effect of suppressing an increase in voltage caused by the energy generated during regenerative operation of the motor.

In the composite module 3 according to the third preferred embodiment, the IGBT emitter terminal 9N categorized as the first terminal group is located adjacent to the converter output terminal 8N, thereby being electrically connected through the external wiring among the IGBT emitter terminal 9N and the converter output terminals 8P and 8N without crossing other wiring patterns. This facilitates the layout for routing the wiring patterns in the entire circuitry including the composite module 3, whereby the design load can be reduced.

Moreover, the composite module 3 has the terminal configuration in which the wiring patterns can be easily drawn, reducing the routing distance of the wiring patterns for the substrate design. Consequently, the entire circuitry including the composite module 3 can be miniaturized and the yields can be improved.

Furthermore, the reduction in the routing distance of the wiring patterns suppresses power consumption, whereby energy saving can be achieved.

Fourth Preferred Embodiment

Figure 7:
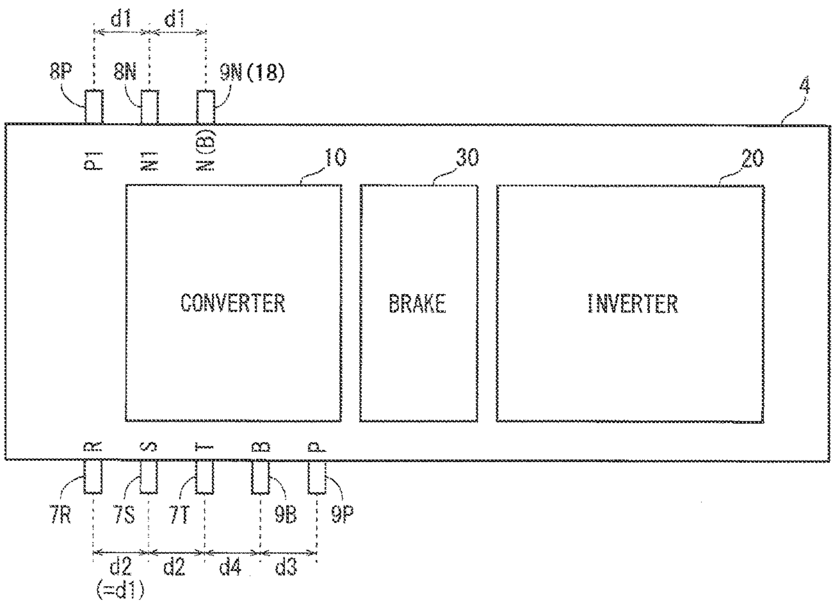
FIG. 7 is a diagram describing a configuration of the composite module according to a fourth preferred embodiment of the present invention.

FIG. 7 is a diagram describing a configuration of a composite module 4 according to a fourth preferred embodiment of the present invention. As shown in FIG. 7, similarly, to the composite module 2 according to the second preferred embodiment, the composite module 4 includes, in addition to the converter 10 and the inverter 20, the brake 30 embedded in the sealing resin.

Similarly to the composite module 3 according to the third preferred embodiment, the composite module 4 includes, as the external terminal 18, the IGBT emitter terminal 9N formed adjacent to the converter output terminal 8N on the one main-surface side having the converter output terminals 8P and 8N provided thereon.

The composite module 4 is electrically connected to the collector of the IGBT 40. The IGBT collector terminal 9B and the DC bus terminal 9P (power source terminal) are adjacently located at a formation pitch d3 away from each other on another main-surface side having the AC input terminals 7R, 7S, and 7T provided thereon. The IGBT collector terminal 9B is located adjacent to the AC input terminal 7T at a formation pitch d4 away therefrom. The formation pitches d3 and d4 may be set to be equal to or different from the formation pitch d1. The configuration except for the above is similar to that of the composite module 3 according to the third preferred embodiment shown in FIG. 6.

Similarly to the composite module 1 according to the first preferred embodiment, the composite module 4 according to the fourth preferred embodiment has the terminal group pitch setting, thereby producing the effect similar to that of the first preferred embodiment.

In addition, the composite module 4 according to the fourth preferred embodiment includes the brake 30 embedded therein, producing the effect similar to that of the composite module 2 according to the second preferred embodiment. The IGBT emitter terminal 9N is located adjacent to the converter output terminal 8N, producing the effect similar to that of the third preferred embodiment.

In the composite module 4 according to the fourth preferred embodiment, the IGBT collector terminal 9B is located adjacent to the DC bus terminal 9P (power source terminal), thereby allowing, for example, a resistance to be provided in the external wiring between the IGBT collector terminal 9B and the DC bus terminal 9P without crossing other wiring patterns. This facilitates the layout for routing the wiring patterns in the entire circuitry including the composite module 4, whereby the design load can be reduced.

<Internal Layout Configuration>

Figure 8:
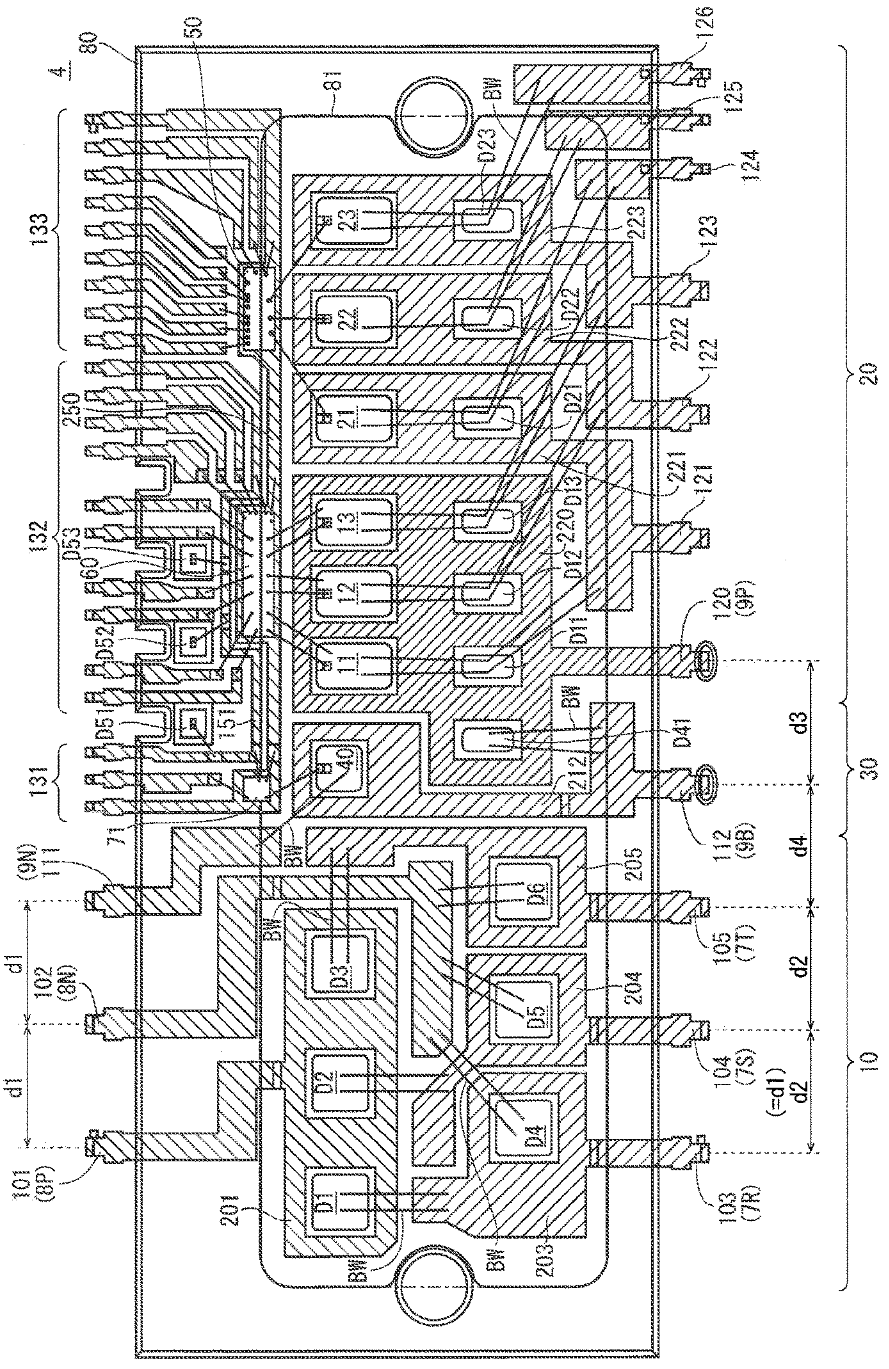
FIG. 8 is a diagram schematically describing a configuration example of an internal layout of the composite module according to the fourth preferred embodiment.

FIG. 8 is a diagram schematically describing a configuration example of the internal layout (a mounted example) of the composite module 4. With reference to FIG. 8, the following describes the layout configuration inside the composite module 4.

As shown in FIG. 8, to form the converter 10, leads 101 to 105 are provided and die pads 201, 203, 204, and 205 are included as part of the lead 101, 103, 104, and 105, respectively. The back-surface electrodes (cathodes) of the diodes D1, D2, and D3 are die-bonded on the die pad 201. The back-surface electrodes (cathodes) of the diodes D4, D5, and D6 are die-bonded on the die pads 203, 204, and 205, respectively.

The front-surface electrodes (anodes) of the diodes D1, D2, and D3 are electrically connected to the die pads 203, 204, and 205 through bonding wires BW and the front-surface electrodes (anodes) of the diodes D4, D5, and D6 are electrically connected in common to the lead 102 through the bonding wires BW. The tip portion of the lead 101 is the converter output terminal 8P. The tip portion of the lead 102 is the converter output terminal 8N. The tip portions of the leads 103, 104, and 105 are the AC input terminals 7R, 7S, and 7T, respectively.

To form part of the inverter 20 and the brake 30, leads 120 to 126 are provided and die pads 220, 221, 222, and 223 are included as part of the leads 120, 121, 122, and 123, respectively.

The back-surface electrodes (collectors) of the IGBTs 11, 12, and 13 and the back-surface electrodes (cathodes) of the diodes D11, D12, D13, and D41 are die-bonded on the die pad 220. The front-surface electrodes (gate portions) of the IGBTs 11, 12, and 13 are electrically connected to an IC 60 through the bonding wires BW. The front-surface electrodes (emitter portions) of the IGBTs 11, 12, and 13 are electrically connected to the front-surface electrodes (anodes) of the diodes D11, D12, and D13 through the bonding wires BW. The front-surface electrodes of the diodes D11, D12, and D13 are electrically connected to the leads 121, 122, and 123 through the bonding wires BW.

The back-surface electrodes (collectors) of the IGBTs 21, 22, and 23 and the back-surface electrodes (cathodes) of the diodes D21, D22, and D23 are die-bonded on the die pads 221, 222, and 223, respectively. The front-surface electrodes (gate portions) of the IGBTs 21, 22, and 23 are electrically connected to an IC 50 through the bonding wires BW. The front-surface electrodes (emitter portions) of the IGBTs 21, 22, and 23 are electrically connected to the front-surface electrodes (anodes) of the diodes D21, D22, and D23 through the bonding wires BW. The front-surface electrodes of the diodes D21, D22, and D23 are electrically connected to the leads 124, 125, and 126 through the bonding wires BW. The tip portion of the lead 120 is the DC bus terminal 9P.

To form the brake 30, leads 111 and 112 are provided and a die pad 212 is included as part of the lead 112.

The back-surface electrode (collector) of the IGBT 40 is die-bonded on the die pad 212. The front-surface electrode (gate portion) of the IGBT 40 is electrically connected to the IC 71 through the bonding wire BW. The front-surface electrode (emitter portion) of the IGBT 40 is electrically connected to the lead 111 through the bonding wire BW. The front-surface electrode (anode) of the diode D41 located on the die pad 220 is electrically connected to the lead 112.

The tip portion of the lead 111 is the IGBT emitter terminal 9N (the external terminal 18) and the tip portion of the lead 112 is the IGBT collector terminal 9B.

The entirety except for the tip portions of the leads 101 to 105, 111, 112, and 120 to 126 and the tip portions of lead groups 131 to 133, which are described later, are resin-sealed with a sealing resin 80. Thus, the most parts of the leads 101 to 105, 111, 112, and 120 to 126 including the diodes D1 to D6, D11 to D13, D21 to D23, and D40 and the IGBTs 11 to 13, 21 to 23, and 40 and the most parts of the lead groups 131 to 133 are resin-sealed with the sealing resin 80, thereby providing the composite module 4 integrally including the converter 10, the inverter 20, and the brake 30 in the sealing resin 80.

The die pads 201, 203 to 205, 212, and 220 to 223 are formed on an insulating sheet 81.

The IC 50, the IC 60, and the IC 71 are die-bonded on a die pad 250. The IC 50 includes the ICs 51, 52, and 53 shown in FIG. 5. The IC 60 includes the ICs 61, 62, and 63 shown in FIG. 5. The lead group 131 related to the IC 71, the lead group 132 related to the IC 60, and the lead group 133 related to the IC 50 are respectively provided. Diodes D51, D52, and D53 serve as the diodes to bootstrap the IC 60. The IC 50, the IC 60, and the IC 71 bear little relevance to the present invention, and the detailed description of, for example, each part and the connection relationship thereof are omitted.

In such layout configuration, the tip portions of the leads 101, 102, and 111 are adjacently located at the formation pitch d1 away from each other and the tip portions of the lead 103, 104, and 105 are adjacently located at the formation pitch d2 (=d1) away from each other as described in the first preferred embodiment (the third preferred embodiment).

In addition, the tip portions of the lead 112 and the lead 120 are adjacently located at the formation pitch d3 away from each other and the tip portions of the lead 112 and the lead 105 are adjacently located at the formation pitch d4 away from each other as described in the fourth preferred embodiment.

The internal layout configuration shown in FIG. 8 has the composite positional relation in which the converter 10 is located on the left side, providing the first-type composite module (corresponding to the composite module 1A shown in FIG. 2) that is a first aspect of the composite module 4 shown in FIG. 7.

The following describes the case in which the second-type composite module (corresponding to the composite module 1B shown in FIG. 3) that is a second aspect of the composite module 4 shown in FIGS. 7 and 8 is provided.

In this case, the layout configuration of the inverter 20 and the brake 30 (the lead 112 (the die pad 212), the leads 120 to 126 (the die pads 220 to 223), the IGBTs 11 to 13, 21 to 23, and 40, and the diodes D11 to D13, D21 to D23, and D41) except for the lead 111 can be unchanged from the layout configuration shown in FIG. 8.

The second-type composite module 4 can be manufactured by slightly changing the shapes of the leads 101 to 105 (the die pads 201, and 203 to 205) or by changing the vertical arrangement thereof, in other words, by mainly changing solely the internal layout only of the converter 10.

The composite module 4 has the terminal group pitch setting described above. Thus, only the internal layout of the converter 10 is mainly changed, to thereby selectively manufacture the first-type composite module 4 (see FIGS. 7 and 2) and the second-type composite module 4 (see FIG. 3) that have opposite positional relations between the first and second terminal groups on the one side and the other side. Similarly to the composite module 4, the composite modules 1, 2, and 3 according to the first, second, and third preferred embodiments can be selectively formed into the first-type and second-type composite modules with relative ease.

<Modification>

According to modifications of the first, second, third, and fourth preferred embodiments, the IGBTs 11 to 13 and 21 to 23 that are the power elements in the inverter 20 of the composite modules 1, 2, 3 and 4 are formed of SiC and the IGBT 40 that is the power element in the brake 30 of the composite modules 2, 3, and 4 is formed of SiC.

The composite modules according to such modifications include the IGBTs 11 to 13, 21 to 23, and 40 that are formed of SiC, to thereby reduce the size of the module while keeping the terminal arrangement of the external terminals. This is effective in miniaturizing each of the composite modules 1, 2, 3, and 4.

In the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device that has a rectangular shape in plan view and integrally includes a converter and an inverter in a sealing resin, said semiconductor device comprising:

a plurality of converter output terminals for external connection that are electrically connected to said converter and are located on one side of said semiconductor device in plan view;

a plurality of converter input terminals for external connection that are electrically connected to said converter and are located on another side facing said one side in plan view; and an adjacent external terminal for external connection that is located adjacent to said plurality of converter output terminals on said one side, said adjacent external terminal being an insulated gate bipolar transistor (IGBT) terminal that is electrically connected to an emitter electrode of an IGBT, wherein no converter output terminal for external connection is located on said another side, no converter input terminal for external connection is located on said one side, said plurality of converter output terminals and said adjacent external terminal are categorized as a first terminal group and said plurality of converter input terminals are categorized as a second terminal group, said first and second terminal groups including an equal number of terminals, and each of first distances between two terminals in said first terminal group that are adjacent to each other is set to be equal to each of second distances between two terminals in said second terminal group that are adjacent to each other.

2. The semiconductor device according to claim 1, further comprising a brake that is integral with said converter and said inverter in said sealing resin and is electrically connected to said inverter.

3. The semiconductor device according to claim 2, wherein said brake includes said IGBT.

4. The semiconductor device according to claim 3, further comprising:

an IGBT collector terminal for external connection that is electrically connected to a collector electrode of said IGBT and is located on said another side; and a power source terminal for external connection that is electrically connected to said brake and said inverter and is located on said another side, wherein said IGBT collector terminal and said power source terminal are located adjacent to each other.

5. The semiconductor device according to claim 1, wherein said inverter includes at least one power element located therein, and said at least one power element is formed of SiC.

* * * * *